United States Patent
Lee et al.

(10) Patent No.: US 6,824,960 B2
(45) Date of Patent: Nov. 30, 2004

(54) METHOD OF MANUFACTURING A FLUID INJECTION DEVICE

(75) Inventors: In-Yao Lee, Shijr (TW); Chih-Ching Chen, Taipei (TW)

(73) Assignee: BENQ Corporation, Taoyuan (TW)

( * ) Notice: Subject to any disclaimer, the term of this patent is extended or adjusted under 35 U.S.C. 154(b) by 95 days.

(21) Appl. No.: 10/373,235

(22) Filed: Feb. 24, 2003

(65) Prior Publication Data

US 2003/0160023 A1 Aug. 28, 2003

(30) Foreign Application Priority Data

Feb. 26, 2002 (TW) ........................................ 91103430 A

(51) Int. Cl.⁷ .............................. G03C 5/00; B44C 1/22
(52) U.S. Cl. ......................... 430/320; 430/323; 216/41; 216/62; 216/99
(58) Field of Search ................................ 430/320, 323; 216/41, 62, 99; 347/41

(56) References Cited

U.S. PATENT DOCUMENTS

| 5,922,218 A | * | 7/1999 | Miyata et al. | 216/27 |
| 6,102,530 A | * | 8/2000 | Kim et al. | 347/65 |

* cited by examiner

*Primary Examiner*—Thorl Chea
(74) *Attorney, Agent, or Firm*—Ladas & Parry LLP

(57) ABSTRACT

A method of manufacturing a fluid injection device. The method of the present invention applies a compensated geometric shape of the unetched isolating portions to increase the additional compensated portion for etching, or the ion implanting process to reduce the etching rate of the unetched isolating portions. Thus, crosstalk or overshoot in the isolating portions of the fluid injection device can be reduced, and the fluid injection device can be precisely manufactured in a small size.

20 Claims, 12 Drawing Sheets

METHOD OF MANUFACTURING A FLUID INJECTION DEVICE

BACKGROUND OF THE INVENTION

1. Field of the Invention

The present invention relates to a method applied to the manufacturing process of a fluid injection device, and particularly to a method of manufacturing a fluid injection device with precise fluid chambers and flow channels by applying a step of etching compensation or an ion implantation step.

2. Description of the Related Art

Presently, fluid injection techniques are widely applied in a multitude of potential applications, such as the liquid droplet injector of inkjet printers, fuel injection systems, drug delivery systems and bioengineering systems. In recent years, semiconductor manufacturing process has generally been applied to fabricate small fluid injection devices with reliability and low cost. Since silicon wafers are commonly used in the semiconductor manufacturing process, such as IC, opt-electronics, microelectronics or MEMS, it is preferable to use the silicon wafer as the substrate for the fluid injection device.

An example of the conventional fluid injection device can be described with reference to FIG. 1. FIG. 1 shows a fluid injection device 10 with a virtual valve, such as a microinjector, disclosed in U.S. Pat. No. 6,102,530. The fluid injection device 10 constitutes a silicon substrate 38, which has a manifold 26 to supply the fluid, a plurality of fluid chambers 14 at a side of the manifold 26 containing the fluid, a plurality of orifices 18 connected to the corresponding fluid chamber 14 to eject the fluid, and a plurality of injection components 20, 22 near the orifices 18.

However, silicon wafers are anisotropic. That is, anisotropic etching occurs along each direction of the lattice of the silicon substrate when etching. This phenomenon can be detailed with reference to FIGS. 2a and 2b.

FIG. 2a is an example of the silicon wafer 500. A corrosion-resisting hard mask layer 510 is provided on the lattice plane {100} of the silicon wafer 500. The hard mask layer 510 is provided with an opening, so that the silicon substrate 520 is etched with an etching fluid (not shown), such as the potassium hydroxide (KOH) solution. In the etching process, the etching rate along each direction of the lattice of the silicon substrate 520 differs, in which etching along the [110] direction has a higher rate. Thus, inclined planes 522, 524 on the lattice plane {111} with a relative angle θ=54.74° to the lattice plane {100} are obtained on the silicon substrate 520.

FIG. 2b is another example of the silicon wafer 500, in which the opening on the hard mask layer 510 in FIG. 2b has a different shape than the opening in FIG. 2a. In this case, an inclined plane 526 on the lattice plane {111} and an inclined plane 528 on the lattice plane {112} are obtained.

Consequently, in the anisotropic etching process for manufacturing the manifold 26 and the fluid chambers 14 of the conventional fluid injection device 10 as shown in FIG. 3a, since the etching rate varies along each direction of the lattice of the silicon substrate 38 in the anisotropic etching process, overshoot (that is, over etching) occurs in a certain portion of the substrate 38 that forms the isolating beams 30 to separate the fluid chambers 14. Thus, the actual size of the fluid chambers 14 manufactured can differ from the desired size in design. In this case, crosstalk between the adjacent fluid chambers 14 may occur, particularly when the fluid chambers 14 are placed in arrays with close pitch.

Further, if the overshoot significantly occurs in the end portions of the isolating beams 30, a plurality of etching tips 31 is formed in these end portions, which further leads to stress concentration. In this case, the strength of the isolating beams 30 is weakened, and the operation lifetime of the fluid injection device 10 is shortened. This stress concentration effect is magnified if the fluid injection device 10 has a relatively small size.

SUMMARY OF THE INVENTION

In view of this, an object of the present invention is to rearrange the manufacturing process of the fluid injection device, so that the fluid injection device can be manufactured in a small and precise structure with relatively reduced crosstalk or overshoot from the anisotropic etching process.

The present invention discloses a method of manufacturing a fluid injection device. The fluid injection device has a plurality of fluid chambers and a plurality of isolating portions separating the fluid chambers, in which the isolating portions are formed with a predetermined geometric shape.

The method of manufacturing the fluid injection device may include the steps of: providing a substrate; providing a mask with a compensating pattern thereon; coating a photoresist layer on the substrate; deploying the compensating pattern onto the photoresist layer to determine a plurality of unetched isolating portions, wherein the unetched isolating portions are formed with a compensated geometric shape larger than the predetermined geometric shape; and etching the substrate to form the isolating portions with the predetermined geometric shape.

In the above-mentioned method, deployment comprises steps of: performing exposure on the photoresist layer with the mask; and performing development on the photoresist layer to form the unetched isolating portions on the photoresist layer. The compensated geometric shape can be a shape formed by increasing a certain area to the predetermined geometric shape of the isolating portions along at least one direction of the lattice of the substrate.

Further, the method of manufacturing the fluid injection device may include the steps of: providing a substrate; performing ion implanting on a predetermined area on the substrate for the isolating portions; and etching the substrate to form the isolating portions with the predetermined geometric shape.

In the above-mentioned method, the ion used for implantation can be boron, phosphorous, or arsenic.

Further, the method of manufacturing the fluid injection device may include the steps of: providing a substrate; providing a mask with a pattern thereon; coating a photoresist layer on the substrate; deploying the pattern onto the photoresist layer to determine a plurality of isolating geometries, wherein the isolating geometries are formed larger than the predetermined geometric shape; and etching the substrate to form the isolating portions with the predetermined geometric shape, wherein the isolating portions comprise at least one extrusion to prevent the adjacent fluid chambers from crosstalk in ejecting the fluid.

In the above-mentioned method, the deploying step is described in the following detailed steps of: performing exposure on the photoresist layer with the mask; and performing development on the photoresist layer to form the isolating geometries on the photoresist layer.

The fluid injection device applied in the method of the present invention may have a fluid storage tank storing the fluid, a manifold connecting the fluid storage tank and the fluid chambers for guiding the fluid from the fluid storage tank in the fluid chambers, a plurality of heating devices respectively disposed in the fluid chambers for heating the fluid in the corresponding fluid chamber, a plate structure supporting the heating devices, and a plurality of injection orifices respectively connected in the fluid chambers for ejecting the fluid in the corresponding fluid chamber therethrough.

Further, in the above-mentioned methods of the present invention, the substrate can be a monocrystalline material or an anisotropic material, and the etching step can be applied with a wet etching process.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The present invention relates to a method of manufacturing a fluid injection device that reduces the crosstalk or overshoot problems in the conventional fluid injection device due to the anisotropic etching process. Examples and preferred embodiments of the present invention will be hereinafter described with reference to the drawings.

Figure 1:
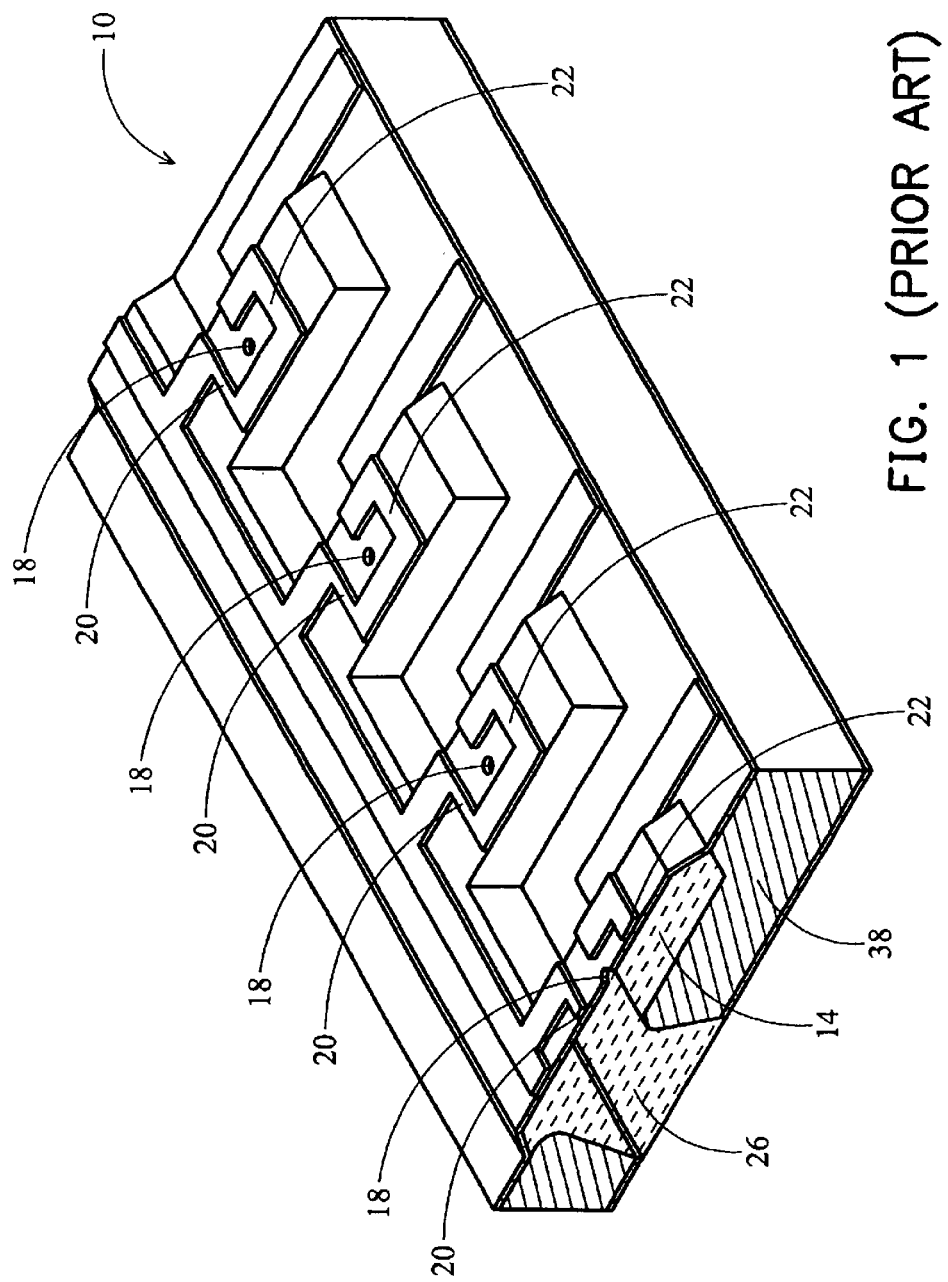
FIG. 1 is a schematic view of the conventional fluid injection device.
Figure 2A:
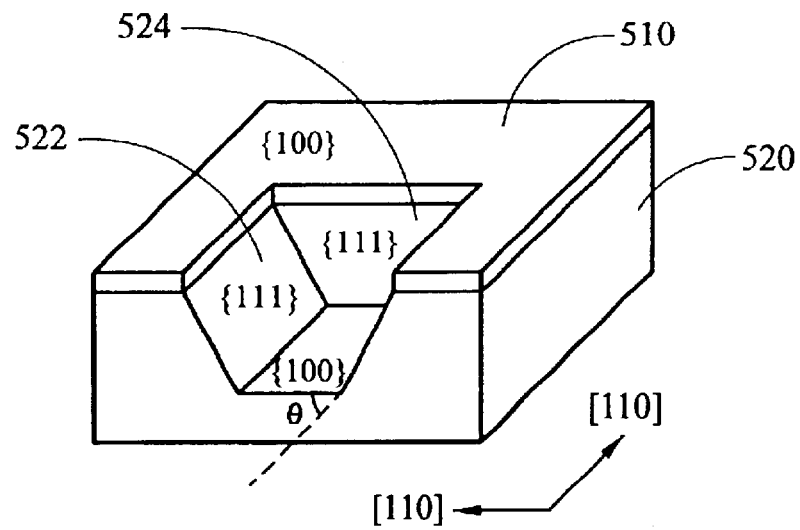
FIG. 2a and FIG. 2b are schematic views of the anisotropic etching mechanism of the silicon wafer.
Figure 2B:
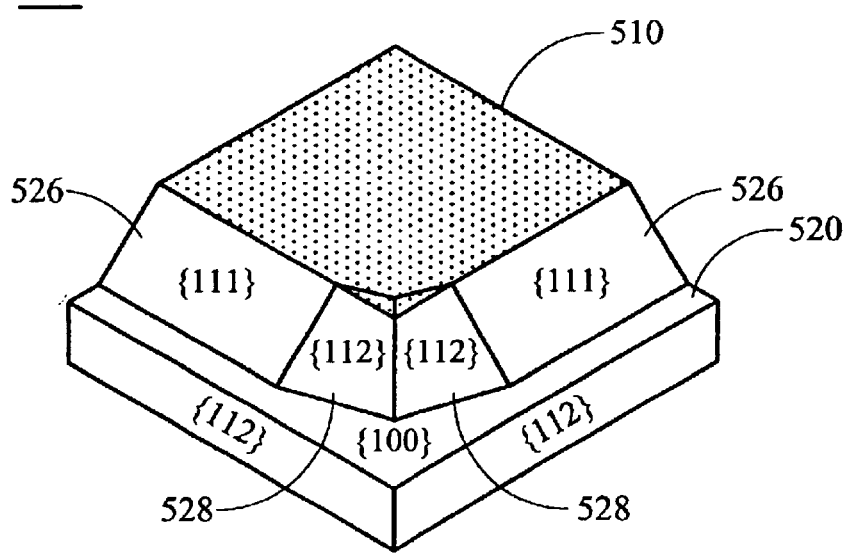
Figure 3A:
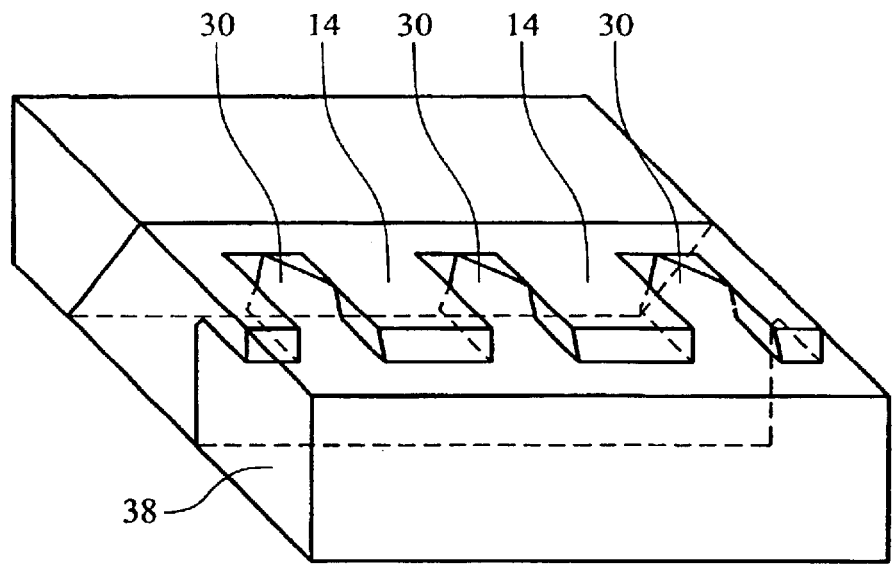
FIG. 3a is a schematic view of the conventional fluid injection device, in which overshoot occurs on the isolating beams.
Figure 3B:
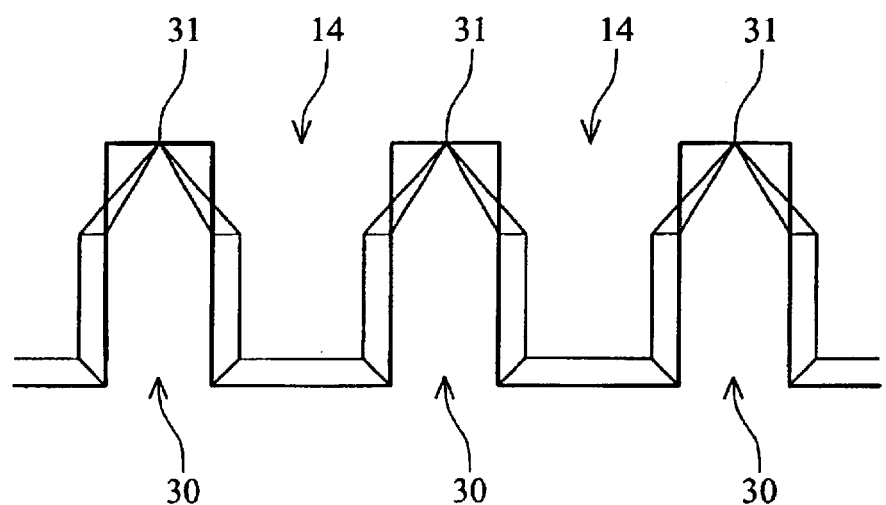
FIG. 3b is a schematic view showing the etching tips of the conventional fluid injection device.

The fluid injection device manufactured with the method of the present invention has a similar structure to the conventional fluid injection device 10 shown in FIG. 1, FIG. 3a and FIG. 3b. Specifically, the fluid injection device has a plurality of fluid chambers (fluid cavities) 14 and a plurality of isolating portions (isolating beams) 30 to separate the fluid chambers 14. Each of the isolating portions 30 is formed with a predetermined geometric shape, such as a rectangular cuboid. Further, the fluid injection device may have a fluid storage tank (not shown) storing the fluid, a manifold 26 connecting the fluid storage tank and the fluid chambers 14, and a plurality of injection orifices 18 respectively connected in the fluid chambers 14 for ejecting the fluid in the corresponding fluid chamber 14 through the injection orifice 18. The manifold 26 guides the fluid from the fluid storage tank in the fluid chambers 14. Further, the fluid injection device may have a plurality of heating devices respectively disposed in the fluid chambers 14 for heating the fluid in the corresponding fluid chamber 14, and a plate structure supporting the heating devices.

Figure 4:
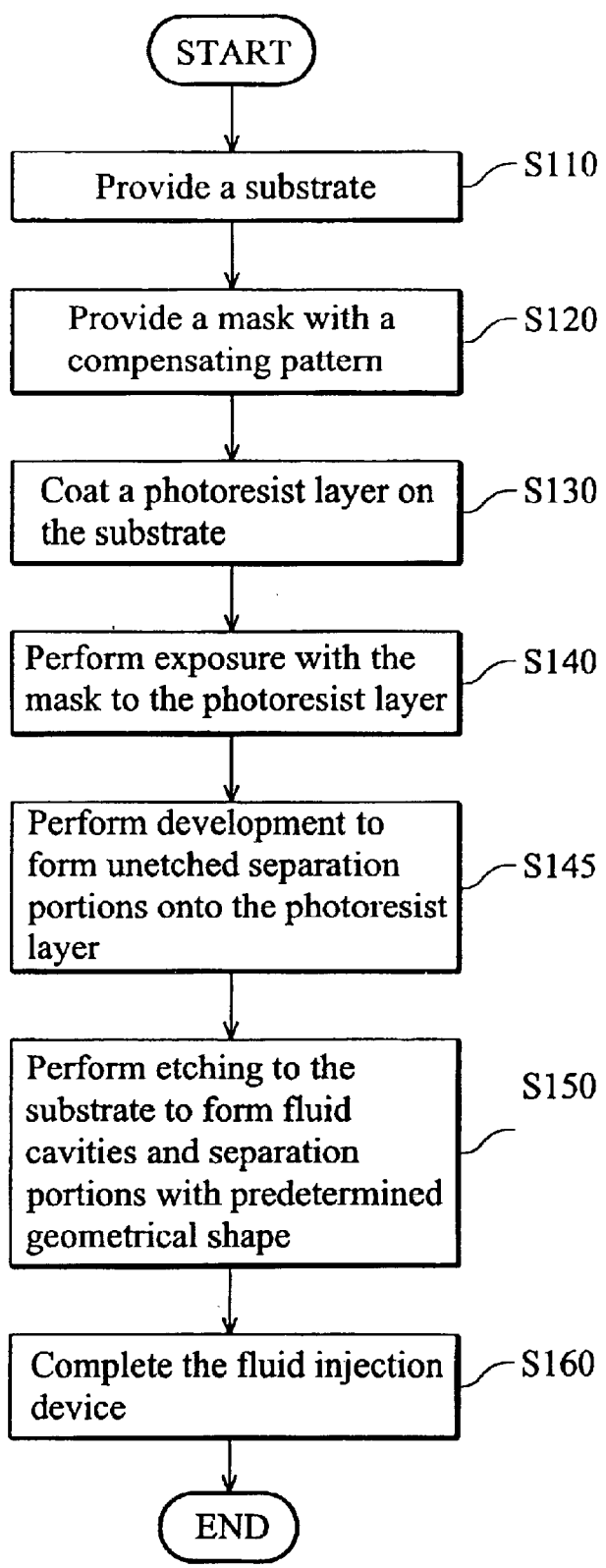
FIG. 4 is a flow chart showing an example of the method of manufacturing a fluid injection device of the present invention.

FIG. 4 shows an example of the method of the present invention. When a fluid injection device is set to be fabricated, a substrate is provided (step S110). The substrate can be a monocrystalline material, or an anisotropic material, such as the widely-used silicon substrate. Then, a mask with a compensating pattern is provided (step S120) for exposure of the substrate. The compensating pattern relates to a compensated geometric shape of the unetched isolating portions to be formed in the following steps of exposure and development. Then, a photoresist layer is coated on the substrate (step S130), and the mask is applied to perform exposure on the photoresist layer (step S140), and the photoresist layer performs development (step S145) to deploy the compensating pattern onto the photoresist layer, so that the unetched isolating portions with the compensated geometric shape can be determined. The unetched isolating portions should be formed with a compensated geometric shape larger than the predetermined geometric shape.

After the deploying step of the compensating pattern, an etching process, such as a wet etching process, is applied to the substrate. Since the compensated geometric shape is larger than the predetermined geometric shape, the unetched isolating portions with the compensated geometric shape can be etched to form the fluid cavities (the fluid chambers) and the isolating portions with the predetermined geometric shape (step S150). Thus, the overshoot can be reduced, and the fluid injection device is achieved with precise fluid chambers, flow channels and isolating beams (step S160).

In the above-mentioned method of the present invention, the compensated geometric shape is larger than the predetermined geometric shape. That is, the compensated geometric shape can be regarded as the predetermined geometric shape along with an additional compensated portion. Since the substrate of the fluid injection device is a monocrystalline material or an anisotropic material, it is preferable for the compensated geometric shape to be a shape formed by increasing a certain area (that is, the additional compensated portion) to the predetermined geometric shape of the isolating portions along at least one direction of the lattice of the substrate.

Embodiments of the compensated geometric shape can be described in detail with reference to FIGS. 5a to 5d, FIGS.

6a to 6d, and FIGS. 7a to 7d. In these embodiments, the substrate 100 is a silicon substrate, and the predetermined geometric shape of the isolating portions is a rectangular cuboid, similar to the shape of the isolating beams in FIG. 3a and FIG. 3b.

Figure 5A:
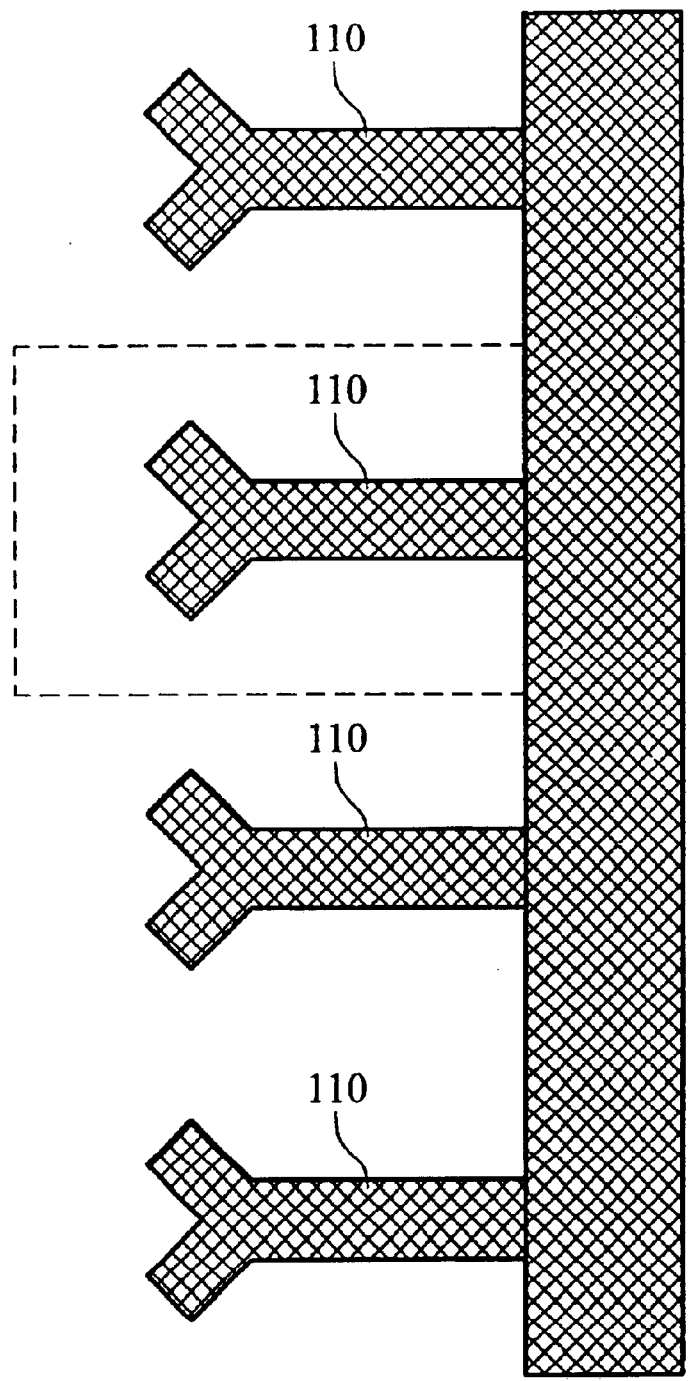
FIG. 5a and FIG. 5b are schematic views of an embodiment of the compensated geometric shape of the unetched isolating portions of the present invention.
Figure 5B:
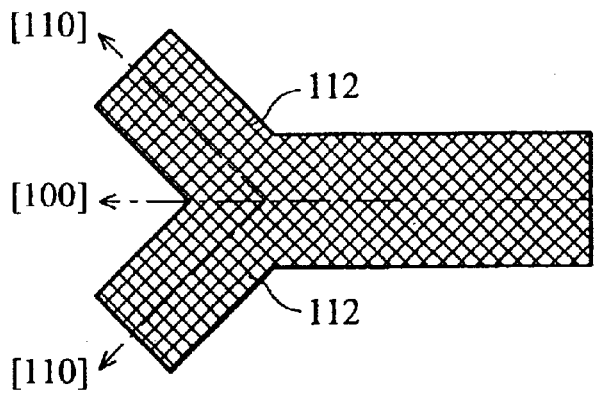

FIGS. 5a and 5b show an embodiment of the compensated geometric shape of the present invention. In FIG. 5a, the silicon substrate 100 has a plurality of unetched isolating portions 110. According to the prior art, etching along the [110] direction of the lattice of the silicon substrate has a higher rate. Thus, the compensated geometric shape of the unetched isolating portions 110 is extended from the predetermined geometric shape toward the [110] direction, forming the additional compensated portions 112, as shown in FIG. 5b.

Figure 5C:
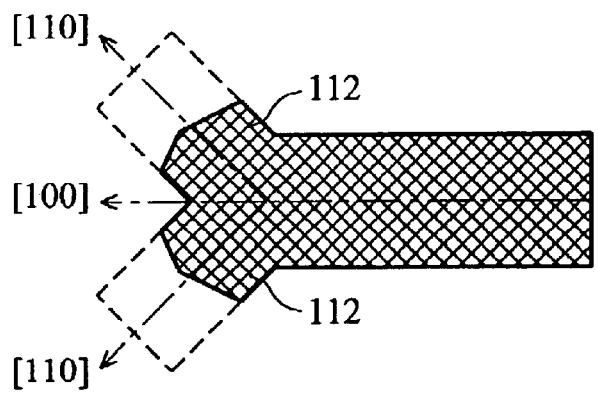
FIG. 5c and FIG. 5d are schematic views showing the shape change of the unetched isolating portions in FIG. 5b in etching.
Figure 5D:
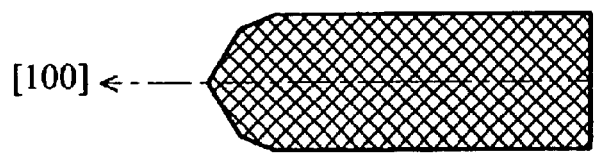

FIGS. 5c and 5d show the shape change of the unetched isolating portions 110 in FIG. 5b in the etching process. The additional compensated portions 112 are etched at a higher rate, so that even if a slight overshoot occurs as shown in FIG. 5d, the etching tip is not significant. Thus, the isolating portions may have a shape very similar to the predetermined geometric shape.

Figure 6A:
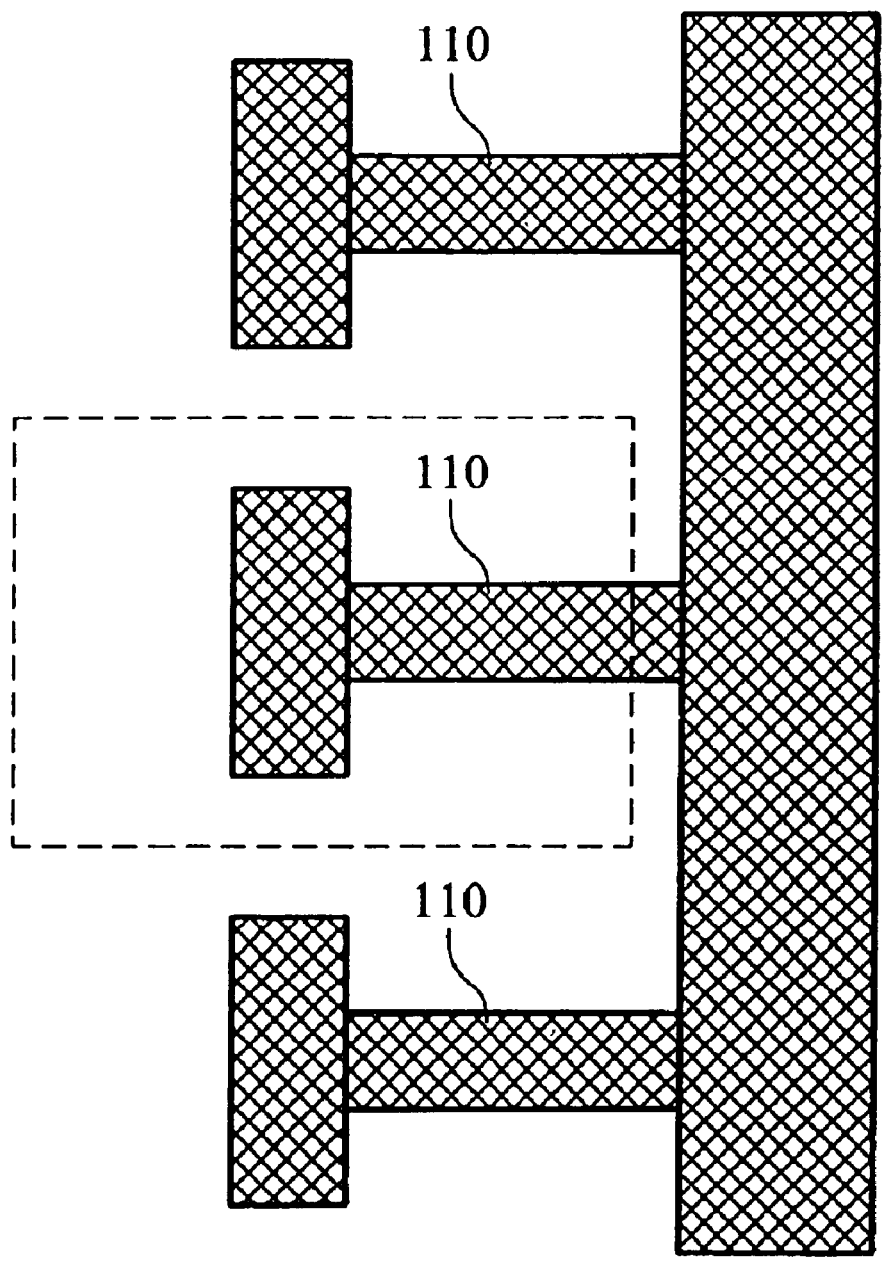
FIG. 6a and FIG. 6b are schematic views of a further embodiment of the compensated geometric shape of the unetched isolating portions of the present invention.
Figure 6B:
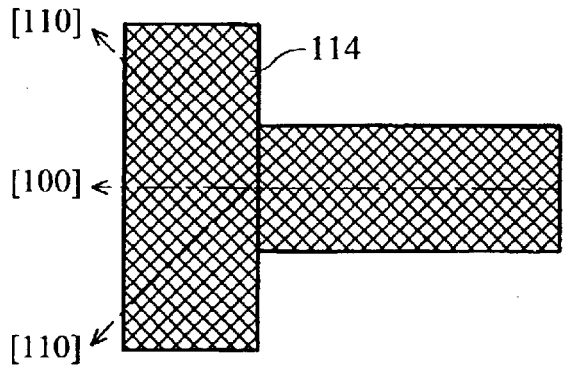

FIGS. 6a and 6b show another embodiment of the compensated geometric shape of the present invention. In FIG. 6a, the silicon substrate 100 has a plurality of unetched isolating portions 110. Since etching along the [110] direction of the lattice of the silicon substrate has a higher rate, the compensated geometric shape of the unetched isolating portions 110 can be extended from the predetermined geometric shape toward both sides, forming the additional compensated portions 114 with a longer width than the predetermined geometric shape, as shown in FIG. 6b.

Figure 6C:
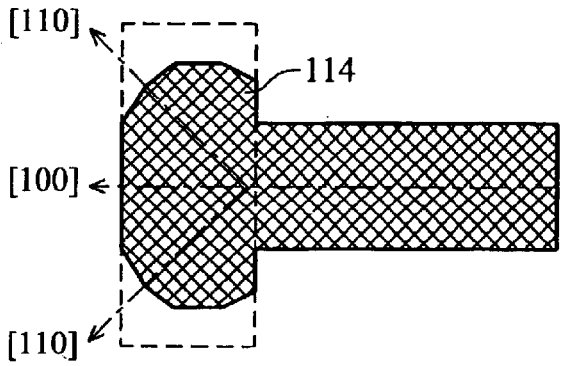
FIG. 6c and FIG. 6d are schematic views showing the shape change of the unetched isolating portions in FIG. 6b in etching.
Figure 6D:
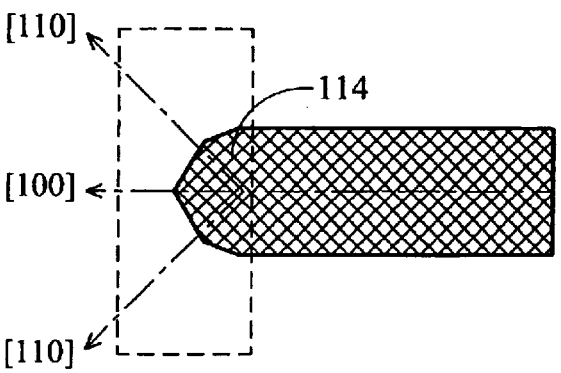

FIGS. 6c and 6d show the shape change of the unetched isolating portions 110 in FIG. 6b in the etching process. In this case, the additional compensated portions 114 are also etched at a higher rate, so that even if a slight overshoot occurs as shown in FIG. 6d, the etching tip is not significant. Thus, the isolating portions may have a shape very similar to the predetermined geometric shape.

Figure 7A:
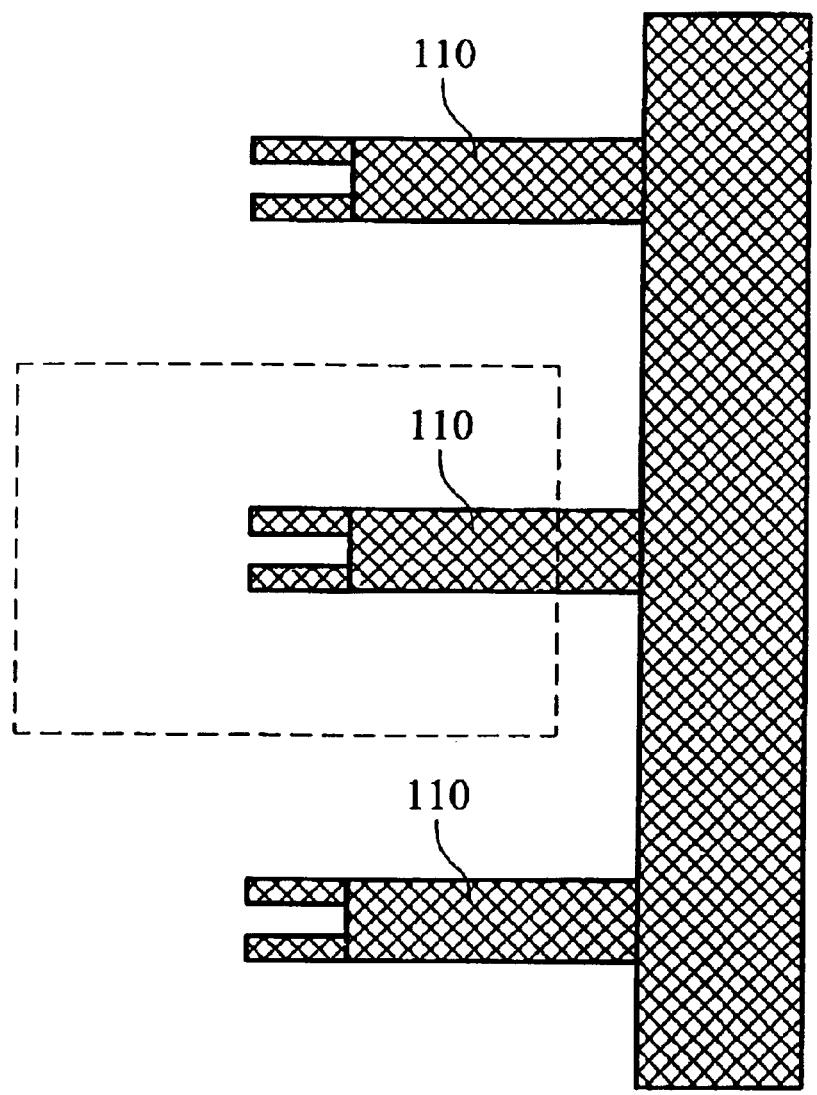
FIG. 7a and FIG. 7b are schematic views of a further embodiment of the compensated geometric shape of the unetched isolating portions of the present invention.
Figure 7B:
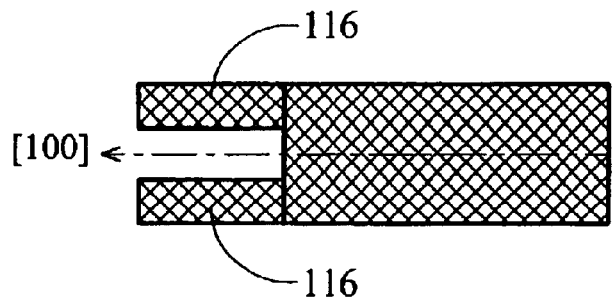

FIGS. 7a and 7b show a further embodiment of the compensated geometric shape of the present invention. In FIG. 7a, the silicon substrate 100 has a plurality of unetched isolating portions 110. Since etching along the [110] direction of the lattice of the silicon substrate has a higher rate, the corner portions of the predetermined geometric shape are rapidly etched. Thus, the compensated geometric shape of the unetched isolating portions 110 can be extended from the corner portions of the predetermined geometric shape toward the [100] direction, forming the additional compensated portions 116 with a longer length near the corner portions than the intermediate portion on the width of the predetermined geometric shape, as shown in FIG. 7b.

Figure 7C:
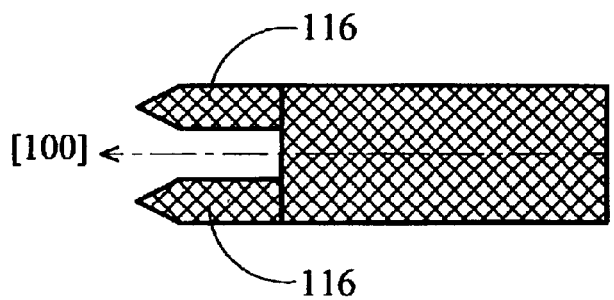
FIG. 7c and FIG. 7d are schematic views showing the shape change of the unetched isolating portions in FIG. 7b in etching.
Figure 7D:
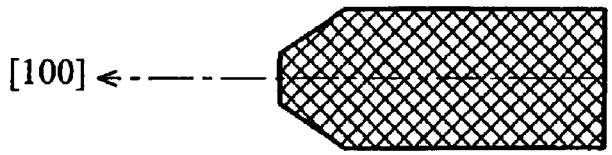

FIGS. 7c and 7d show the shape change of the unetched isolating portions 110 in FIG. 7b in the etching process. In this case, the additional compensated portions 116 are also etched at a higher rate, so that even if a slight overshoot occurs as shown in FIG. 7d, the etching tip is not significant. Thus, the isolating portions may have a shape very similar to the predetermined geometric shape.

It should be mentioned that the predetermined geometric shape of the isolating portions of the fluid injection device is not limited to the rectangular cuboid shape. Thus, the compensated geometric shape applied in the present invention should be modified according to the predetermined geometric shape. Preferably, the compensated geometric shape can be a shape formed by increasing a certain area (that is, the additional compensated portion) to the predetermined geometric shape of the isolating portions along at least one direction of the lattice of the substrate.

Further, in the step S150 of the above-mentioned method, it is preferable that the isolating portions are controlled to have at least one extrusion, such as the shape illustrated in FIGS. 5c, 6c or 7c. In this case, the adjacent fluid chambers of the fluid injection device can be prevented from crosstalk in ejecting the fluid.

Figure 8:
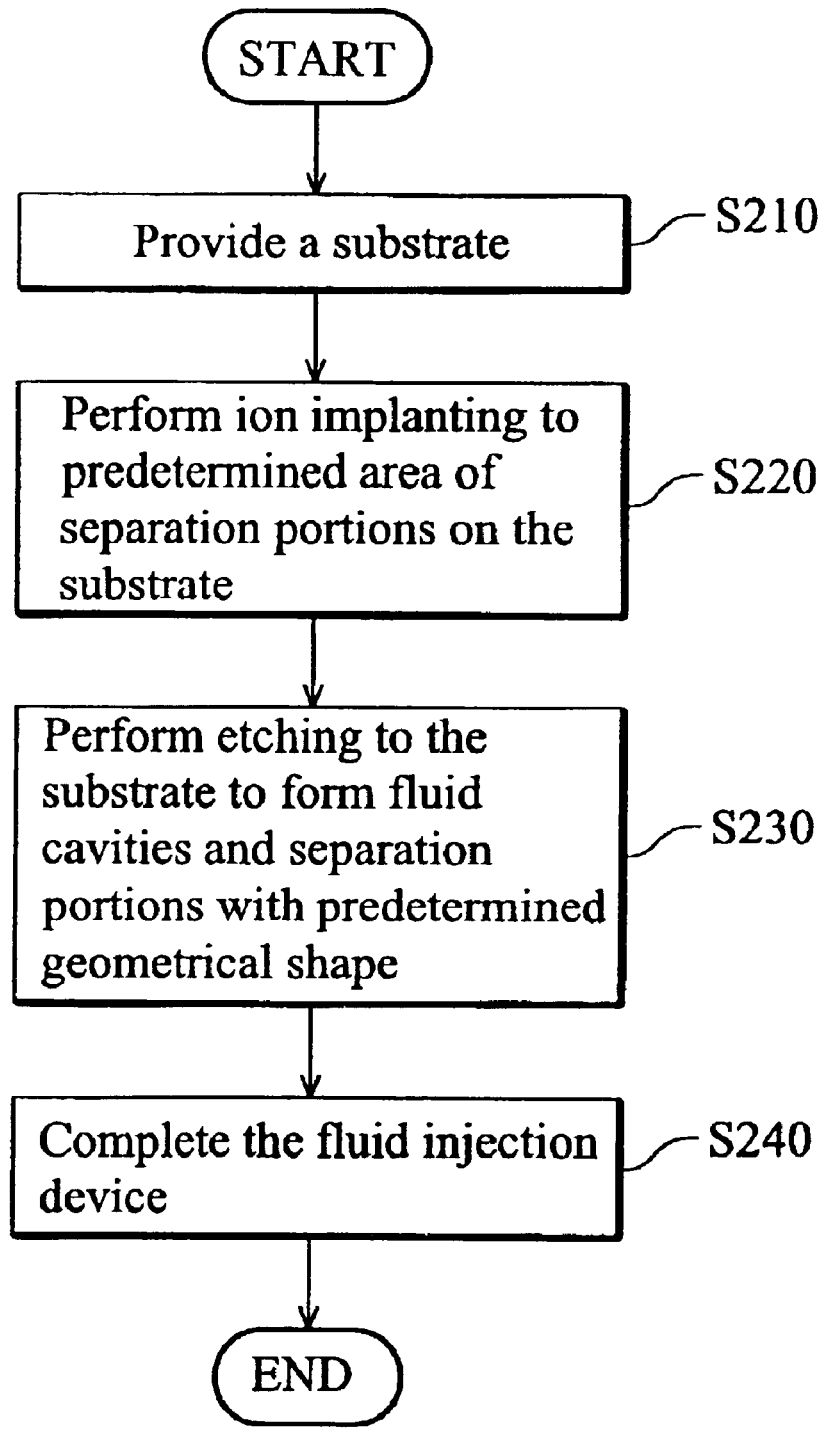
FIG. 8 is a flow chart showing another example of the method of manufacturing a fluid injection device of the present invention.
Figures 9A, 9B:
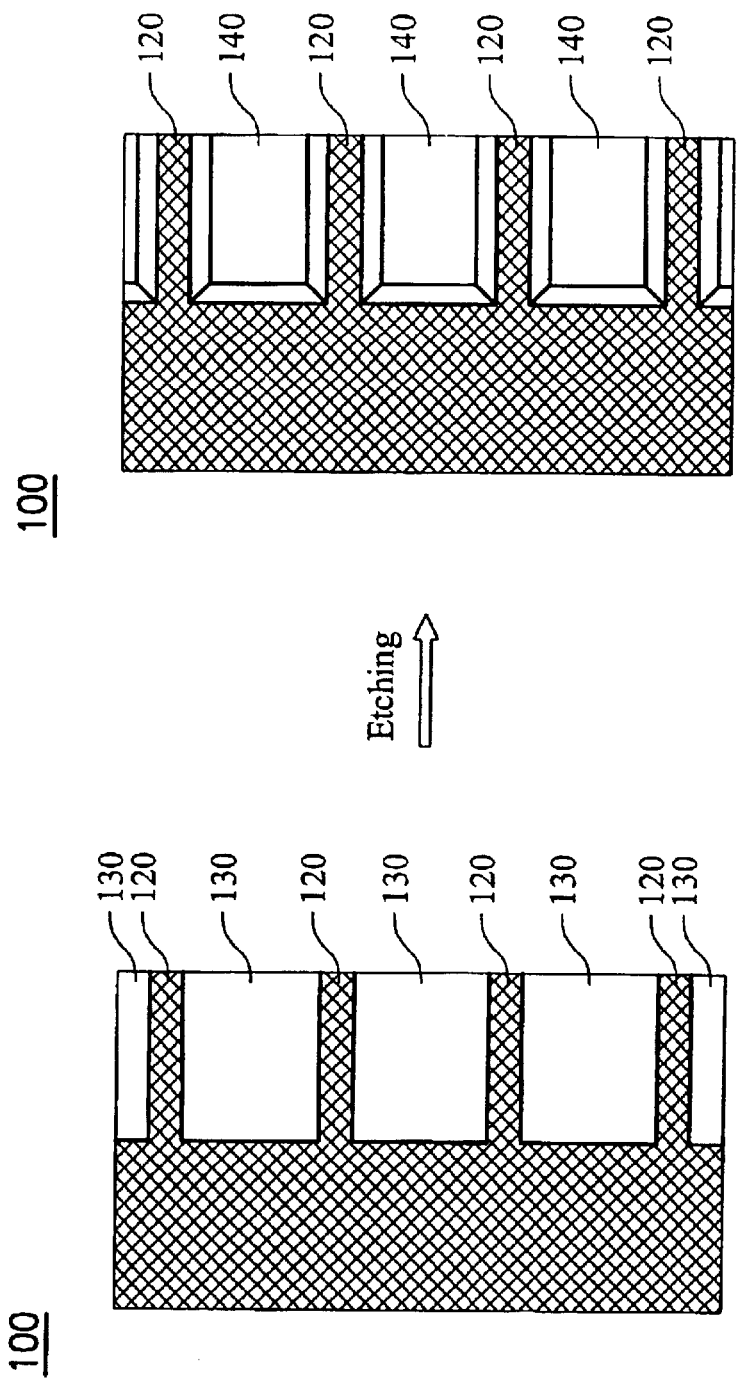
FIG. 9a is a schematic view of an embodiment of ion implanting shape of the unetched isolating portions of the present invention.
FIG. 9b is a schematic view showing the unetched isolating portions in FIG. 9a in etching.

FIG. 8 shows another example of the method of the present invention. When a fluid injection device is set to be fabricated, a substrate is provided (step S210). The substrate can be a monocrystalline material, or an anisotropic material, such as the widely-used silicon substrate. Then, ion implanting is performed to a predetermined area of the isolating portions on the substrate (step S220). In this case, as shown in FIG. 9a, the substrate 100 is formed with an implanted region 120 as the unetched isolating portions and an unimplanted region 130 as the fluid cavities (that is, the fluid chambers). The implanted region 120 has a relatively reduced etching rate.

After the ion implanting step, an etching process, such as a wet etching process, is applied to the substrate. In this case, the unetched isolating portions (the implanted region) are slightly etched to form the isolating portions 120 with the predetermined geometric shape, and the unimplanted region 130 is further expanded to form the fluid chambers 140 (step S230). Thus, the overshoot can be reduced, and the fluid injection device is achieved with precise fluid chambers, flow channels and isolating beams (step S240).

It should be noted that the ion used for implantation can be boron, phosphorous, or arsenic. Further, the wet etching process is preferably applied in the present invention. However, the etching process in the present invention is not limited to the above-mentioned wet etching process.

The method of manufacturing the fluid injection device of the present invention applies the compensated geometric shape of the unetched isolating portions to increase the additional compensated portion for etching, or the ion implanting process to reduce the etching rate of the unetched isolating portions. Thus, the fluid injection device can be manufactured in a small and precise structure with relatively reduced crosstalk or overshoot due to the anisotropic etching process.

While the present invention has been described with reference to the preferred embodiments thereof, it is to be understood that the invention is not limited to the described embodiments or constructions. On the contrary, the invention is intended to cover various modifications and similar arrangements as is apparent to those skilled in the art. Therefore, the scope of the appended claims should be accorded the broadest interpretation so as to encompass all such modifications and similar arrangements.

What is claimed is:

1. A method of manufacturing a fluid injection device, the fluid injection device having a plurality of fluid chambers and a plurality of isolating portions separating the fluid chambers, the isolating portions being formed with a predetermined geometric shape, the method comprising the steps of:

providing a substrate;

providing a mask with a compensating pattern thereon;

coating a photoresist layer on the substrate;

deploying the compensating pattern onto the photoresist layer to determine a plurality of unetched isolating portions, wherein the unetched isolating portions are formed with a compensated geometric shape larger than the predetermined geometric shape; and etching the substrate to form the isolating portions with the predetermined geometric shape.

2. The method according to claim 1, wherein the deploying step comprises the steps of:

performing exposure on the photoresist layer with the mask; and performing development on the photoresist layer to form the unetched isolating portions on the photoresist layer.

3. The method according to claim 1, wherein the fluid injection device comprises:

a fluid storage tank storing the fluid;

a manifold connecting the fluid storage tank and the fluid chambers for guiding the fluid from the fluid storage tank in the fluid chambers;

a plurality of heating devices respectively disposed in the fluid chambers, each of the heating devices heating the fluid in the corresponding fluid chamber;

a plate structure supporting the heating devices; and a plurality of injection orifices respectively connected in the fluid chambers, wherein the fluid in the fluid chamber is ejected through the corresponding injection orifice.

4. The method according to claim 1, wherein the substrate comprises a monocrystalline material.

5. The method according to claim 1, wherein the substrate comprises an anisotropic material.

6. The method according to claim 1, wherein the compensated geometric shape is a shape formed by increasing a certain area to the predetermined geometric shape of the isolating portions along at least one direction of lattice of the substrate.

7. The method according to claim 1, wherein the etching step is applied with a wet etching process.

8. A method of manufacturing a fluid injection device, the fluid injection device having a plurality of fluid chambers and a plurality of isolating portions separating the fluid chambers, the isolating portions being formed with a predetermined geometric shape, the method comprising the steps of:

providing a substrate;

performing ion implanting on a predetermined area on the substrate for the isolating portions; and etching the substrate to form the isolating portions with the predetermined geometric shape.

9. The method according to claim 8, wherein the fluid injection device comprises:

a fluid storage tank storing the fluid;

a manifold connecting the fluid storage tank and the fluid chambers for guiding the fluid from the fluid storage tank in the fluid chambers;

a plurality of heating devices respectively disposed in the fluid chambers, each of the heating devices heating the fluid in the corresponding fluid chamber;

a plate structure supporting the heating devices; and a plurality of injection orifices respectively connected in the fluid chambers, wherein the fluid in the fluid chamber is ejected through the corresponding injection orifice.

10. The method according to claim 8, wherein the substrate comprises a monocrystalline material.

11. The method according to claim 8, wherein the substrate comprises an anisotropic material.

12. The method according to claim 8, wherein the etching step is applied with a wet etching process.

13. The method according to claim 8, wherein an ion selected from a group comprising boron ion, phosphorous ion and arsenic ion is for the ion implanting step.

14. A method of manufacturing a fluid injection device, the fluid injection device having a plurality of fluid chambers and a plurality of isolating portions separating the fluid chambers, the isolating portions being formed with a predetermined geometric shape, the method comprising the steps of:

providing a substrate;

providing a mask with a pattern thereon;

coating a photoresist layer on the substrate;

deploying the pattern onto the photoresist layer to determine a plurality of isolating geometries, wherein the isolating geometries are formed larger than the predetermined geometric shape; and etching the substrate to form the isolating portions with the predetermined geometric shape, wherein the isolating portions comprise at least one extrusion to prevent the adjacent fluid chambers from crosstalk in ejecting the fluid.

15. The method according to claim 14, wherein the deploying step comprises the steps of:

performing exposure on the photoresist layer with the mask; and performing development on the photoresist layer to form the isolating geometries on the photoresist layer.

16. The method according to claim 14, wherein the fluid injection device comprises:

a fluid storage tank storing the fluid;

a manifold connecting the fluid storage tank and the fluid chambers for guiding the fluid from the fluid storage tank in the fluid chambers;

a plurality of heating devices respectively disposed in the fluid chambers, each of the heating devices heating the fluid in the corresponding fluid chamber;

a plate structure supporting the heating devices; and a plurality of injection orifices respectively connected in the fluid chambers, wherein the fluid in the fluid chamber is ejected through the corresponding injection orifice.

17. The method according to claim 14, wherein the substrate comprises a monocrystalline material.

18. The method according to claim 14, wherein the substrate comprises an anisotropic material.

19. The method according to claim 14, wherein the compensated geometric shape is a shape formed by increasing a certain area to the predetermined geometric shape of the isolating portions along at least one direction of lattice of the substrate.

20. The method according to claim 14, wherein the etching step is applied with a wet etching process.

* * * * *